US011217016B1

(12) United States Patent
Mason

(10) Patent No.: US 11,217,016 B1
(45) Date of Patent: Jan. 4, 2022

(54) SYSTEMS AND METHODS FOR GENERATING A PROXY MESH FOR AN ARTIST-AUTHORED MESH USING CONFORMED SMOOTHING

(71) Applicant: Electronic Arts Inc., Redwood City, CA (US)

(72) Inventor: Ashton Mason, Brighton (GB)

(73) Assignee: Electronic Arts Inc., Redwood City, CA (US)

( * ) Notice: Subject to any disclaimer, the term of this patent is extended or adjusted under 35 U.S.C. 154(b) by 0 days.

(21) Appl. No.: 17/102,681

(22) Filed: Nov. 24, 2020

(51) Int. Cl.
*G06T 17/20* (2006.01)

(52) U.S. Cl.
CPC .................. *G06T 17/20* (2013.01)

(58) Field of Classification Search
None
See application file for complete search history.

(56) References Cited

U.S. PATENT DOCUMENTS

| | | | | |
|---|---|---|---|---|
| 6,405,151 B1* | 6/2002 | Fujii | ............... | G06T 17/20 345/427 |
| 6,867,774 B1* | 3/2005 | Halmshaw | ............ | G06T 15/08 345/424 |
| 6,879,324 B1* | 4/2005 | Hoppe | ............... | G06T 17/20 345/419 |
| 2003/0191554 A1* | 10/2003 | Russell | ............ | G06T 17/20 700/187 |
| 2005/0168460 A1* | 8/2005 | Razdan | ............ | G06F 16/2428 345/419 |
| 2008/0297507 A1* | 12/2008 | Chen | ............... | G06T 17/20 345/424 |
| 2013/0300735 A1* | 11/2013 | Schmidt | ............ | G06T 19/20 345/419 |
| 2014/0146047 A1* | 5/2014 | Wu | ............... | G06T 17/00 345/424 |
| 2017/0263051 A1* | 9/2017 | Shipkov | ............ | G06T 19/20 |
| 2019/0043254 A1* | 2/2019 | Taubin | ............ | G06T 15/08 |
| 2019/0221034 A1 | 7/2019 | Mason | | |
| 2020/0050722 A1* | 2/2020 | McClennan | ...... | G06F 30/23 |
| 2020/0184705 A1* | 6/2020 | Li | ............... | G06T 1/20 |
| 2021/0150000 A1* | 5/2021 | Hallet | ............ | G06F 30/20 |

OTHER PUBLICATIONS

Vollmer et al. "Improved Laplacian Smoothing of Noisy Surface Meshes," Eurographics '99, Computer Graphics Forum, vol. 18, No. 3, pp. 131-138. (Sep. 1999).

* cited by examiner

*Primary Examiner* — Sultana M Zalalee
(74) *Attorney, Agent, or Firm* — Leydig, Voit & Mayer, Ltd.

(57) ABSTRACT

A method, device, and computer-readable storage medium for generating a proxy mesh are disclosed. The method includes: receiving a reference mesh comprising a polygonal mesh that is a computer representation of a three-dimensional object; receiving a smoothed mesh corresponding to the reference mesh; selecting a given vertex in the smoothed mesh; identifying neighbor vertices of the given vertex in the smoothed mesh; for each neighbor vertex of the given vertex, determining a nearest location on the reference mesh overlaid on the smoothed mesh; determining an average position of the nearest locations on the reference mesh for the neighbor vertices of the given vertex; setting a new location of a vertex in a smoothed output polygonal mesh corresponding to the given vertex to the average position; and outputting the smoothed output polygonal mesh as a proxy mesh for the reference mesh.

20 Claims, 12 Drawing Sheets

… (1)

US 11,217,016 B1

SYSTEMS AND METHODS FOR GENERATING A PROXY MESH FOR AN ARTIST-AUTHORED MESH USING CONFORMED SMOOTHING

FIELD

This disclosure generally relates to computer graphics and, more particularly, to systems and methods for generating a proxy mesh for an artist-authored mesh using conformed smoothing.

BACKGROUND

For three-dimensional (3D) graphics applications, such as video games or animated films, efficient processing of data by reducing computational complexity of a given operation is often useful. This is particularly the case in real-time applications, such as video games.

Various operations can be performed using computer generated objects in a scene. An object may be represented as a polygonal mesh, which comprises a collection of vertices, edges, and faces that define the shape and/or boundary of the object.

One technique for reducing the computational complexity of an operation involving an artist-authored object is to perform the operation using a "proxy object." A proxy object may be a simpler object (i.e., a simpler polygonal mesh) made to look like the artist-authored object. The proxy object can be used as a stand-in for the artist-authored object for performing operations involving the artist-authored object to reduce computational complexity, such as, for example, when the artist-authored object is only visible from far away from a camera location. In some implementations, the full resolution artist-authored object may not be needed for the operation, and so there are circumstances in which a lower resolution, simplified object (i.e., the proxy object) is more appropriate to use in the operation in order to reduce the resource cost of performing the operation.

One conventional approach to generating a proxy object involves Laplacian smoothing. In Laplacian smoothing, a polygonal mesh is updated in a series of steps. In each step, each vertex of the polygonal mesh is moved to a new location that is calculated as an average of the positions of the neighbor vertices of the vertex in the polygonal mesh. The neighbor vertices are the vertices connected to a given vertex by an edge. A well-known problem of Laplacian smoothing is that it tends to "wither" the polygonal mesh, reducing its volume and making it thinner. Too much withering can make the final mesh that results from multiple passes of performing Laplacian smoothing a poor match for the original polygonal mesh, albeit very smooth, thus making the final mesh a poor choice to use as a proxy object.

As such, there remains a need in the art for an improved system and method for generating a proxy object of an artist-authored object.

SUMMARY

Embodiments of the disclosure provide a method, device, and computer-readable storage medium for generating a proxy mesh. The method includes: receiving a reference mesh, wherein the reference mesh comprises a polygonal mesh that is a computer representation of a three-dimensional (3D) object; receiving a smoothed mesh corresponding to the reference mesh; selecting a given vertex in the smoothed mesh; identifying neighbor vertices of the given vertex in the smoothed mesh; for each neighbor vertex of the given vertex in the smoothed mesh, determining a nearest location on the reference mesh overlaid on the smoothed mesh; determining an average position of the nearest locations on the reference mesh for the neighbor vertices of the given vertex; setting a new location of a vertex in a smoothed output polygonal mesh corresponding to the given vertex to the average position; and outputting the smoothed output polygonal mesh as a proxy mesh for the reference mesh.

In some embodiments, the smoothed mesh comprises a boundary mesh, where the boundary mesh comprises a polygonal mesh that is generated based on a voxel volume corresponding to the reference mesh. Generating the boundary mesh may comprise: generating a 3D voxel grid corresponding to the reference mesh, wherein the 3D voxel grid comprises a set of voxels that approximates a shape of the reference mesh; filling voids in the 3D voxel grid to generate a voxel volume; and extracting a boundary of the voxel volume to generate the boundary mesh.

DETAILED DESCRIPTION

Figure 1:
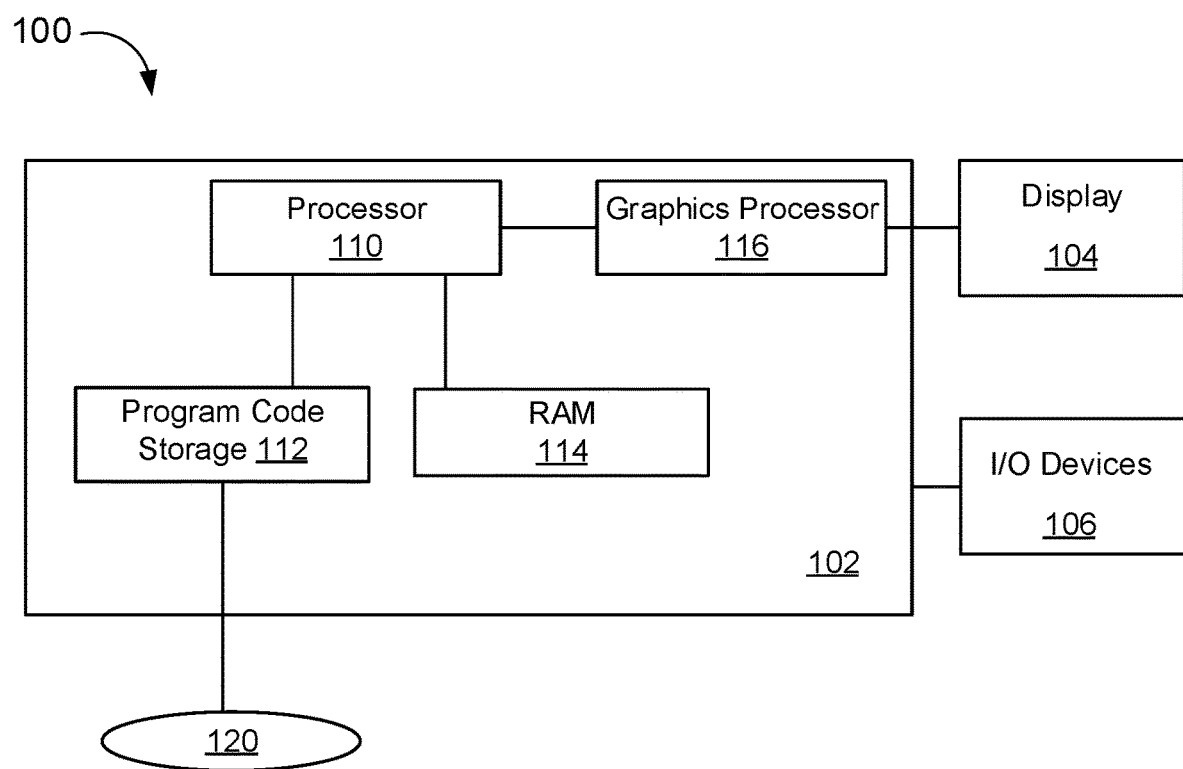
FIG. 1 is a block diagram of a computer system for rendering images, according to aspects of the present disclosure.

The following detailed description is exemplary in nature and is not intended to limit the disclosure or the application and uses of the disclosure. Furthermore, there is no intention to be bound by any expressed or implied theory presented in the preceding technical field, background, summary, brief description of the drawings, or the following detailed description.

In conventional approaches, in the context of computer generated objects represented as polygonal meshes, a proxy mesh for an artist-authored mesh can be made using Laplacian smoothing techniques. However, as described, these proxy meshes generated by Laplacian smoothing are often withered and/or oversimplified such that they lack any discernible detail and are poor representations of the original, artist-authored meshes. In the context of video games, these issues with using Laplacian smoothing for creating proxy meshes can be noticeable to players, degrading the overall gameplay experience.

Embodiments of the disclosure provide a system and method for generating a proxy mesh for an artist-authored mesh using conformed smoothing. A voxel volume is created from a polygonal mesh received as input. A boundary of the voxel volume is extracted to generate a boundary mesh corresponding to the voxel volume. The boundary mesh could itself be used as a proxy mesh, but in some instances, the boundary mesh is blocky (i.e., because it is based on a voxel volume), so smoothing of the boundary mesh may provide better results.

According to the disclosed embodiments, the boundary mesh can be smoothed using conformed smoothing, which takes into account the locations of vertices in the original polygonal mesh received as input, as described in greater detail below. The disclosed embodiments thereby preserve more features and details of the original mesh relative to a proxy mesh created using Laplacian smoothing.

In the disclosed embodiments, a proxy object is generated based on a known input object (e.g., an input polygonal mesh). This is a bit different and unusual for techniques involving Laplacian smoothing, since more typically the mesh being smoothed was acquired somehow (e.g., by a 3D laser scan of a real-world object), and so the mesh being smoothed is itself the only available reference for what the mesh being smoothed "should look like."

As described in greater detail herein, a technique for conformed smoothing is disclosed where, when computing a location for a given vertex of a mesh during the smoothing process, instead of averaging the current positions of the neighbor vertices of a vertex on the mesh being smoothed (i.e., like in Laplacian smoothing), the new locations for the vertex take into consideration the nearest locations on the original input mesh for the neighbor vertices in the mesh being smoothed. These nearest locations can be determined by overlaying the original input mesh onto the mesh being smoothed, and determining the nearest location on a polygon of the original input mesh for a given vertex on the mesh being smoothed. The nearest locations in the original input mesh for the neighbor vertices of a vertex in the mesh being smoothed are then averaged to determine the new location of the vertex in an output mesh. Multiple iterations of performing conformed smoothing can be performed to arrive at the final proxy object, where each iteration refers back to the original input object to find the nearest locations in the original input mesh for the neighbor vertices of a vertex in the mesh being smoothed.

Taking the context of video games as an example, the display of a video game is generally a video sequence presented to a display device capable of displaying the video sequence. The video sequence typically comprises a plurality of frames. By showing frames in succession in sequence order, simulated objects appear to move. A game engine typically generates frames in real-time response to user input, so rendering time is often constrained.

As used herein, a "frame" refers to an image of the video sequence. In some systems, such as interleaved displays, the frame might comprise multiple fields or more complex constructs, but generally a frame can be thought of as a view into a computer-generated scene at a particular time or short time window. For example, with 60 frames-per-second video, if one frame represents the scene at t=0 seconds, then the next frame would represent the scene at t=1/60 seconds. In some cases, a frame might represent the scene from t=0 seconds to t=1/60 seconds, but in the simple case, the frame is a snapshot in time.

A "scene" comprises those simulated objects that are positioned in a world coordinate space within a view pyramid, view rectangular prism, or other shaped view space. In some approaches, the scene comprises all objects (that are not obscured by other objects) within a view pyramid defined by a view point and a view rectangle with boundaries being the perspective planes through the view point and each edge of the view rectangle, possibly truncated by a background.

The simulated objects can be generated entirely from mathematical models describing the shape of the objects (such as arms and a torso described by a set of plane and/or curve surfaces), generated from stored images (such as the face of a famous person), or a combination thereof. If a game engine (or more specifically, a rendering engine that is part of the game engine or used by the game engine) has data as to where each object or portion of an object is in a scene, the frame for that scene can be rendered using standard rendering techniques.

A scene may comprise several objects or entities with some of the objects or entities being animated, in that the objects or entities may appear to move either in response to game engine rules or user input. For example, in a basketball game, a character for one of the basketball players might shoot a basket in response to user input, while a defending player will attempt to block the shooter in response to logic that is part of the game rules (e.g., an artificial intelligence component of the game rules might include a rule that defenders block shots when a shot attempt is detected) and when the ball moves through the net, the net will move in response to the ball. The net is expected to be inanimate, but the players' movements are expected to be animated and natural-appearing. Animated objects are typically referred to herein generically as characters and, in specific examples, such as animation of a football, soccer, baseball, basketball, or other sports game, the characters are typically simulated players in the game. In many cases, the characters correspond to actual sports figures and those actual sports figures might have contributed motion capture data for use in animating their corresponding character. Players and characters might be nonhuman, simulated robots, or other character types.

In some cases, an artist-authored object that is visible in a scene can be composed of may sub-objects, each of which can be quite complex and include many surfaces. For example, for an object represented as a polygonal mesh, the object may be composed of a set of polygonal meshes that form the complete object. As described herein, one technique for reducing the computational complexity of an operation involving an artist-authored object is to perform the operation using a "proxy object." A proxy object may a simpler object (e.g., a simpler polygonal mesh) made to look like the artist-authored object. The proxy object can be used as a stand-in for the artist-authored object for performing operations involving the artist-authored object to reduce computational complexity, such as, for example, when the artist-authored object is only visible from far away from a camera location. In some implementations, the full resolution artist-authored object may not be needed, and so there are circumstances in which a lower resolution, simplified object like the proxy object is more appropriate in order to reduce the resource cost.

Turning to the drawings, FIG. 1 is a block diagram of a computer system 100 for rendering images, according to aspects of the present disclosure. The computer system 100 may be, for example, used for rendering images of a video game. The computer system 100 is shown comprising a console 102 coupled to a display 104 and input/output (I/O) devices 106. Console 102 is shown comprising a processor 110, program code storage 112, temporary data storage 114, and a graphics processor 116. Console 102 may be a handheld video game device, a video game console (e.g., special purpose computing device) for operating video games, a general-purpose laptop or desktop computer, or other suitable computing system, such as a mobile phone or tablet computer. Although shown as one processor in FIG. 1, processor 110 may include one or more processors having one or more processing cores. Similarly, although shown as one processor in FIG. 1, graphics processor 116 may include one or more processors having one or more processing cores.

Program code storage 112 may be ROM (read only-memory), RAM (random access memory), DRAM (dynamic random access memory), SRAM (static random access memory), hard disk, other magnetic storage, optical storage, other storage or a combination or variation of these storage device types. In some embodiments, a portion of the program code is stored in ROM that is programmable (e.g., ROM, PROM (programmable read-only memory), EPROM (erasable programmable read-only memory), EEPROM (electrically erasable programmable read-only memory), etc.) and a portion of the program code is stored on removable media such as a disc 120 (e.g., CD-ROM, DVD-ROM, etc.), or may be stored on a cartridge, memory chip, or the like, or obtained over a network or other electronic channel as needed. In some implementations, program code can be found embodied in a non-transitory computer-readable storage medium.

Temporary data storage 114 is usable to store variables and other game and processor data. In some embodiments, temporary data storage 114 is RAM and stores data that is generated during play of a video game, and portions thereof may also be reserved for frame buffers, depth buffers, polygon lists, texture storage, and/or other data needed or usable for rendering images as part of a video game presentation.

In one embodiment, I/O devices 106 are devices a user interacts with to play a video game or otherwise interact with console 102. I/O devices 106 may include any device for interacting with console 102, including but not limited to a video game controller, joystick, keyboard, mouse, keypad, VR (virtual reality) headset or device, etc.

Display 104 can any type of display device, including a television, computer monitor, laptop screen, mobile device screen, tablet screen, etc. In some embodiments, I/O devices 106 and display 104 comprise a common device, e.g., a touchscreen device. Still further, in some embodiments, one or more of the I/O devices 106 and display 104 is integrated in the console 102.

In various embodiments, since a video game is likely to be such that the particular image sequence presented on the display 104 depends on results of game instruction processing, and those game instructions likely depend, in turn, on user inputs, the console 102 (and the processor 110 and graphics processor 116) are configured to quickly process inputs and render a responsive image sequence in real-time or near real-time.

Various other components may be included in console 102, but are omitted for clarity. An example includes a networking device configured to connect the console 102 to a network, such as the Internet.

Figure 2:
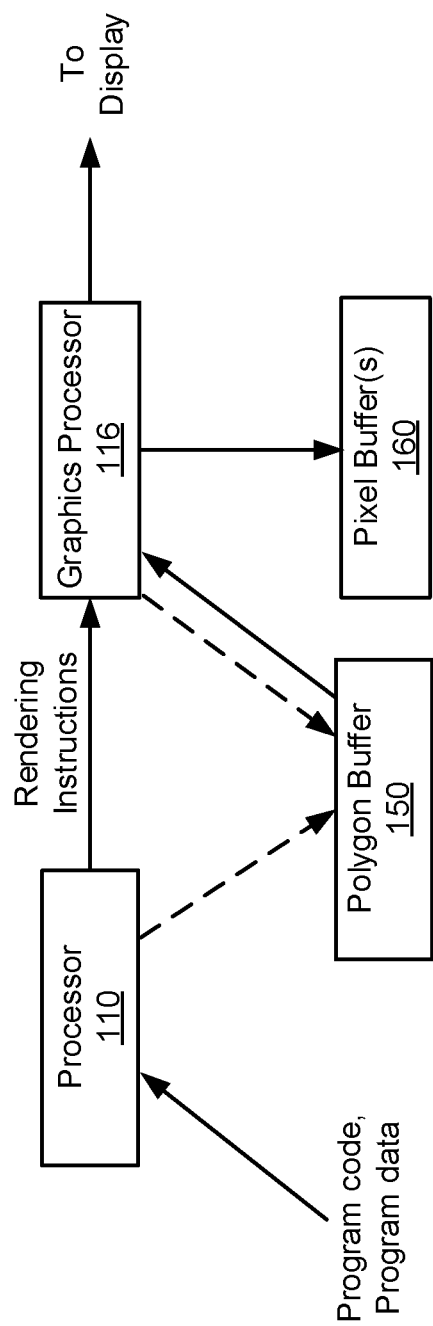
FIG. 2 is a block diagram illustrating processor and buffer interaction, according to one embodiment.

FIG. 2 is a block diagram illustrating processor and buffer interaction, according to one embodiment. As shown in FIG. 2, processor 110 executes program code and program data. In response to executing the program code, processor 110 outputs rendering instructions to graphics processor 116. Graphics processor 116, in turn, reads data from a polygon buffer 150 and interacts with pixel buffer(s) 160 to form an image sequence of one or more images that are output to a display. Alternatively, instead of sending rendering instructions to graphics processor 116 or in addition to sending rendering instructions to graphics processor 116, processor 110 may directly interact with polygon buffer 150. For example, processor 110 could determine which objects are to appear in a view and provide polygon or other mathematical representations of those objects to polygon buffer 150 for subsequent processing by graphics processor 116.

In one example implementation, processor 110 issues high-level graphics commands to graphics processor 116. In some implementations, such high-level graphics commands might be those specified by the OpenGL specification, or those specified by a graphics processor manufacturer.

In one implementation of an image rendering process, graphics processor 116 reads polygon data from polygon buffer 150 for a polygon, processes that polygon and updates pixel buffer(s) 160 accordingly, then moves on to the next polygon until all the polygons are processed, or at least all of the polygons needing to be processed and/or in view are processed. As such, a renderer processes a stream of polygons, even though the polygons may be read in place and be a finite set, where the number of polygons is known or determinable. For memory efficiency and speed, it may be preferable in some implementations that polygons be processed as a stream (as opposed to random access, or other ordering), so that fast, expensive memory used for polygons being processed is not required for all polygons comprising an image.

In some embodiments, processor 110 may load polygon buffer 150 with polygon data in a sort order (if one is possible, which might not be the case where there are overlapping polygons), but more typically polygons are stored in polygon buffer 150 in an unsorted order. It should be understood that although these examples use polygons as the image elements being processed, the apparatus and methods described herein can also be used on image elements other than polygons.

Figure 3:
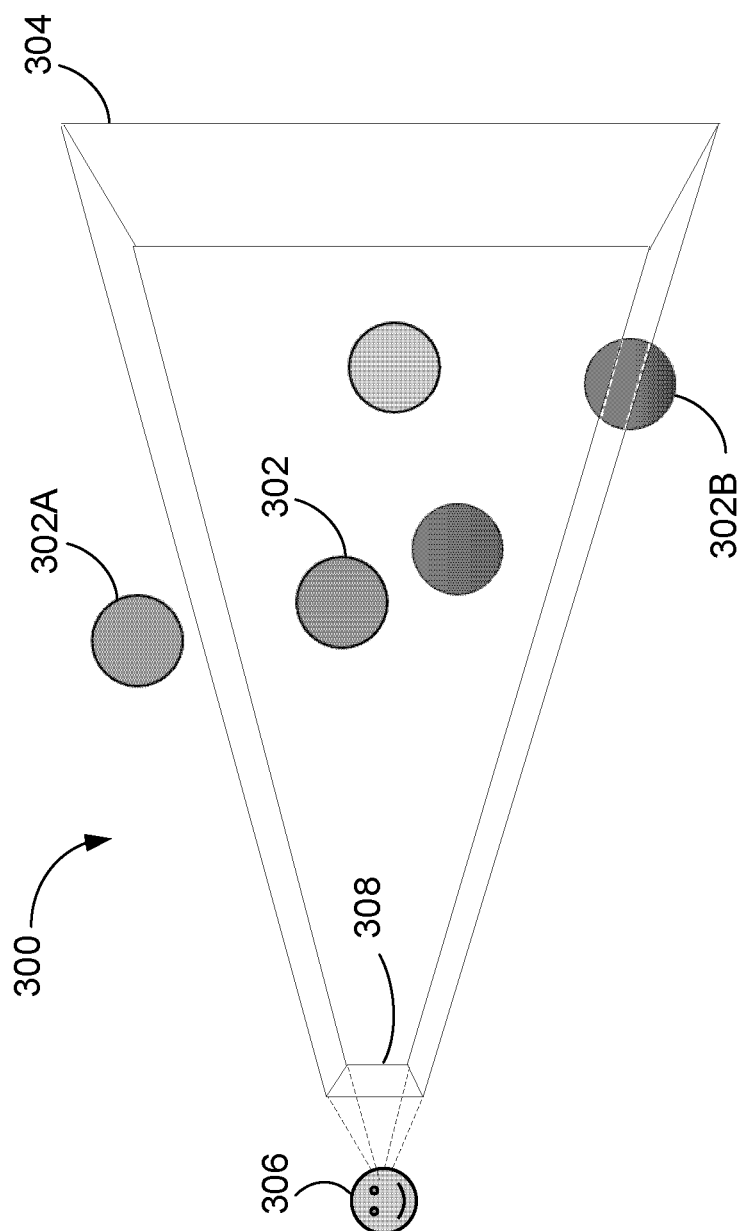
FIG. 3 is a block diagram of a scene to be rendered, according to one embodiment.

FIG. 3 is a block diagram of a scene 300 to be rendered, according to one embodiment. The scene 300 includes a plurality of 3D (three-dimensional) objects, including objects 302, 302A, 302B, for example. Each object can be comprised of a set of polygons, e.g., triangles. A camera 306 is configured to capture an image of the scene 300. A projection of the scene 300 is captured by the camera 306 and is represented by screen space 308. The view of the scene 300 captured by the camera 306 is represented by viewport 304. As shown, some of the objects, such as object 302A of the scene 300, may be outside the viewport 304. As also shown, some of the objects, such as object 302B, may be partially outside the viewport 304.

In one embodiment, the image of the scene 300 that is displayed on a display device corresponds to the screen space 308. The view of the scene 300 that the camera 306 can see (i.e., the image represented by screen space 308) can change as the camera 306 moves in 3D space relative to the objects in the scene. Also, the objects can move in the scene 300.

Figure 4B:
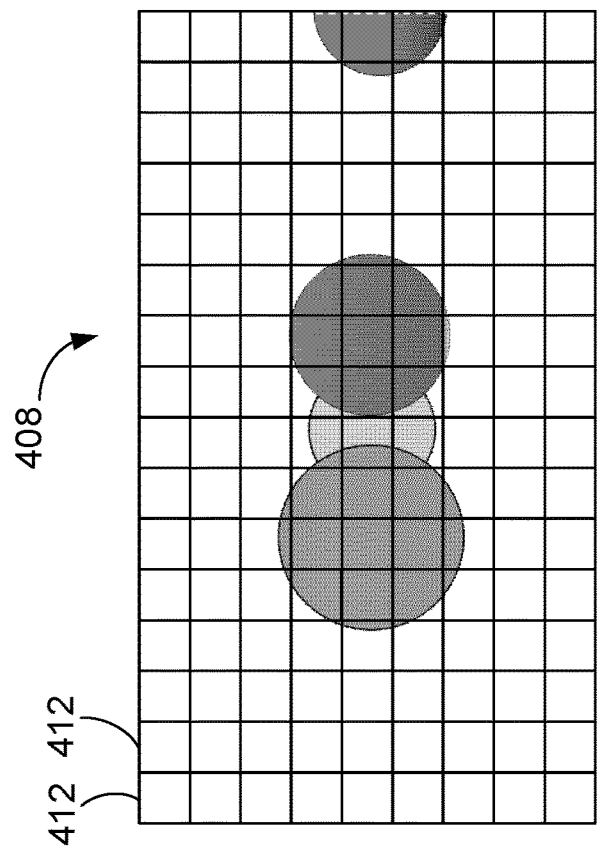
FIG. 4B is an example of an image of a scene, according to one embodiment.
Figure 4A:
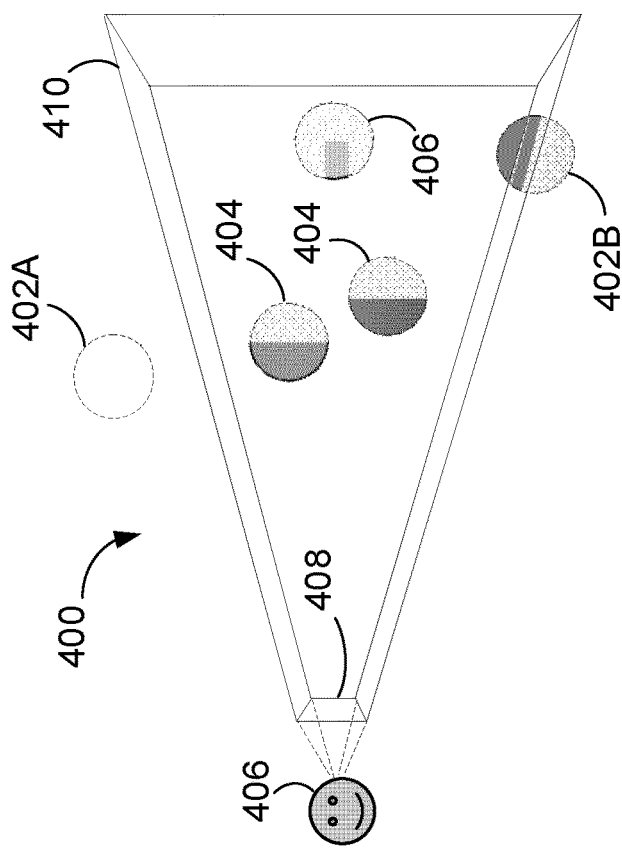
FIG. 4A is a block diagram illustrating rendering of a scene, according to one embodiment.

FIG. 4A is a block diagram illustrating rendering of a scene 400, according to one embodiment. Similar to the diagram shown in FIG. 3, scene 400 includes a plurality of objects. A camera 406 is configured to capture an image of the scene 400, represented in screen space 408. The camera 406 observes the scene 400 through viewport 410.

Various techniques can be used to render the scene 400 in screen space, including rasterization, ray tracing, or other techniques. Rasterization strives to render the pixels as those that are directly visible from the camera 406. In some implementations, rasterization can provide good performance when the renderer (e.g., processor 110 and/or graphics processor 116) does not need any global information about the scene 400.

One rasterization algorithm takes the 3D scene 400, which is described as objects comprising polygons, and renders the scene onto a 2D surface, usually a computer monitor, in screen space 408. The polygons are themselves represented as collections of triangles. Each triangle is represented by three vertices in 3D space. At a very basic level, rasterizers take a stream of vertices, transform them into corresponding 2D points in screen space 408, and fill in the transformed 2D triangles as appropriate.

Rasterization typically involves culling one or more objects or partial objects. Frustum culling removes any objects outside the viewport 410, such as object 402A. Viewport culling removes portions of objects that are partially overlapping the edge of the viewport 410, such as a portion of object 402B. Backface culling removes a back portion 404 of objects that cannot be seen by the camera 406. In some embodiments, depth testing can be performed to remove, on a per pixel basis in screen space 408, portions 406 of objects that are occluded by other objects.

When rasterization is complete, an image of scene in screen space 408 is generated. In some embodiments, pixel density of the screen space 408 can also result in information loss about the objects in the scene 400.

FIG. 4B is an example of an image of a scene, according to one embodiment. The image shown in FIG. 4B represents the image in screen space 408 of the scene 400 captured by the camera 406 in FIG. 4A.

For each pixel 412 in screen space 408, the processor has access to data corresponding to the position of the object within the pixel, the color of the object, the object's orientation, properties of the object (e.g., transparency or translucency), and/or surface roughness information, etc. The result of rasterization is, therefore, a 2D image of the 3D scene.

Although rendering has been described herein using rasterization, other embodiments may involve rendering a scene using other techniques, such as ray tracing, ray casting, radiosity, or any other rendering technique or combination thereof.

Figure 5:
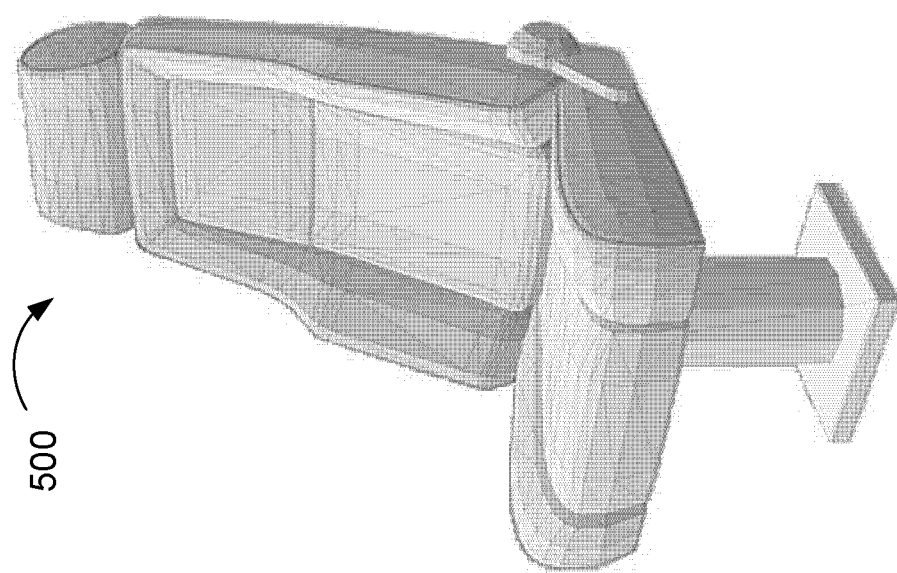
FIG. 5 is an example of a polygonal mesh, according to one embodiment.

FIG. 5 is an example of a polygonal mesh 500, according to one embodiment. As described, the polygonal mesh 500 may correspond to an artist-authored object. In the example shown, the object represents a chair. The polygonal mesh 500 comprises a collection of vertices, edges, and faces that define the shape and/or boundary of the artist-authored object. The faces may include various polygonal shapes, such as triangles, quadrilaterals, convex polygons, concave polygons, regular polygons (e.g., polygons that may have equal length sides and may have equal angles) and/or irregular polygons (e.g., polygons that may not have equal length sides and may not have equal angles).

In various embodiments, the polygonal mesh 500 may be comprised of one or more polygonal sub-meshes. Each sub-mesh may include a series of polygons. As described above, a proxy object can be generated that represents the polygonal mesh 500 to be used in operations to reduce the computational complexity of the operations.

Figure 6:
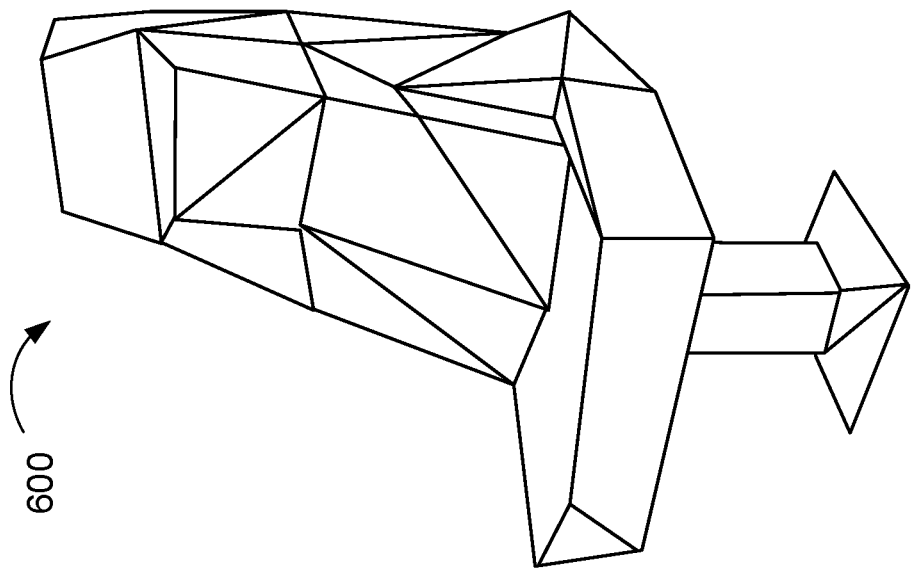
FIG. 6 is an example of a proxy mesh corresponding to the polygonal mesh in FIG. 5, according to one embodiment.

FIG. 6 is an example of a proxy mesh 600 corresponding to the polygonal mesh 500 in FIG. 5, according to one embodiment. As shown, the proxy mesh 600 is a polygonal mesh that includes a smaller number of faces, edges, and vertices compared to the polygonal mesh 500 in FIG. 5. The proxy mesh 600 can be used for graphics operations, such as rendering operations, to reduce a resource cost, where, for the case of mesh simplification, a smaller number of polygons in the mesh corresponds to a smaller resource cost. Using proxy mesh 600 for graphics operations allows the polygonal mesh corresponding to the proxy mesh 600 to be stored using less space and may allow a computing device to render the polygonal mesh more easily and may allow a computing device to use fewer computing resources (e.g., using less processing power, less memory, etc.) when rendering the polygonal mesh. As a result, the proxy mesh 600 is less expensive to store, process, render, etc. As used herein, the term "resource cost" is used to refer to the cost of computing resources in terms of storage, processing, rendering, etc.

Figure 7:
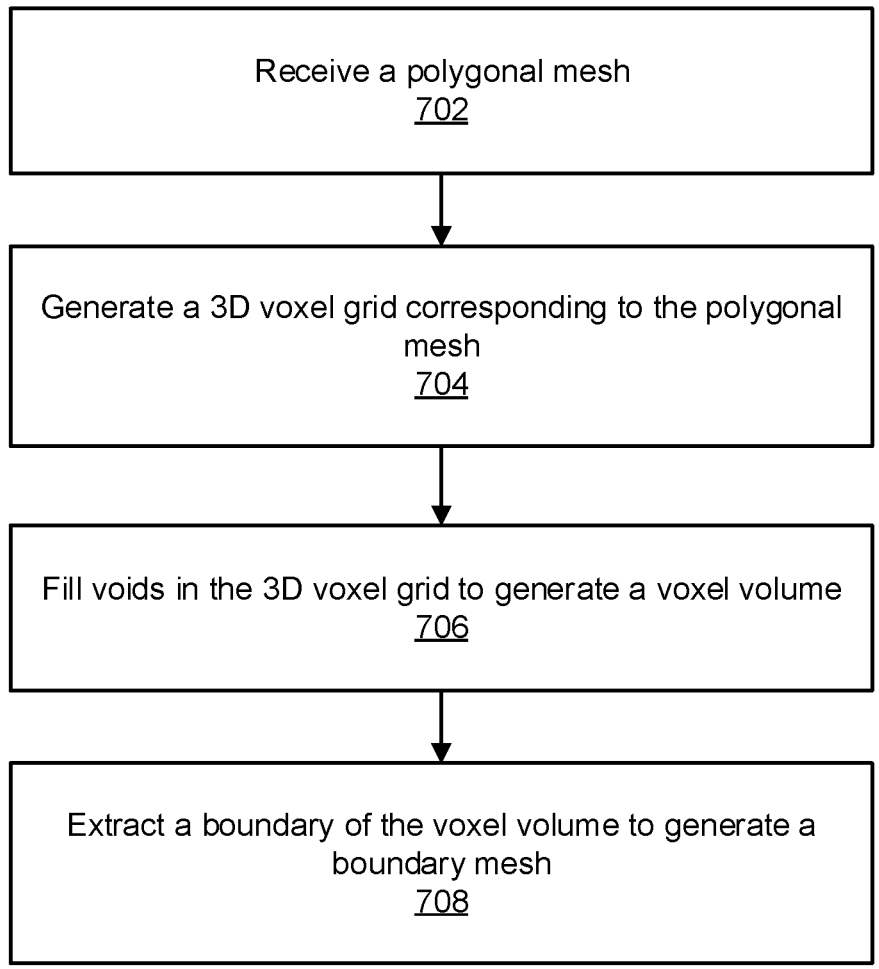
FIG. 7 is a flow diagram of method steps of generating a boundary mesh based on voxelizing a polygonal mesh, according to one embodiment.

FIG. 7 is a flow diagram of method steps of generating a boundary mesh based on voxelizing a polygonal mesh, according to one embodiment. In various implementations, the method can be performed by the processor 110, the graphics processor 116, or a combination of the processor 110 and the graphics processor 116.

Figure 8:
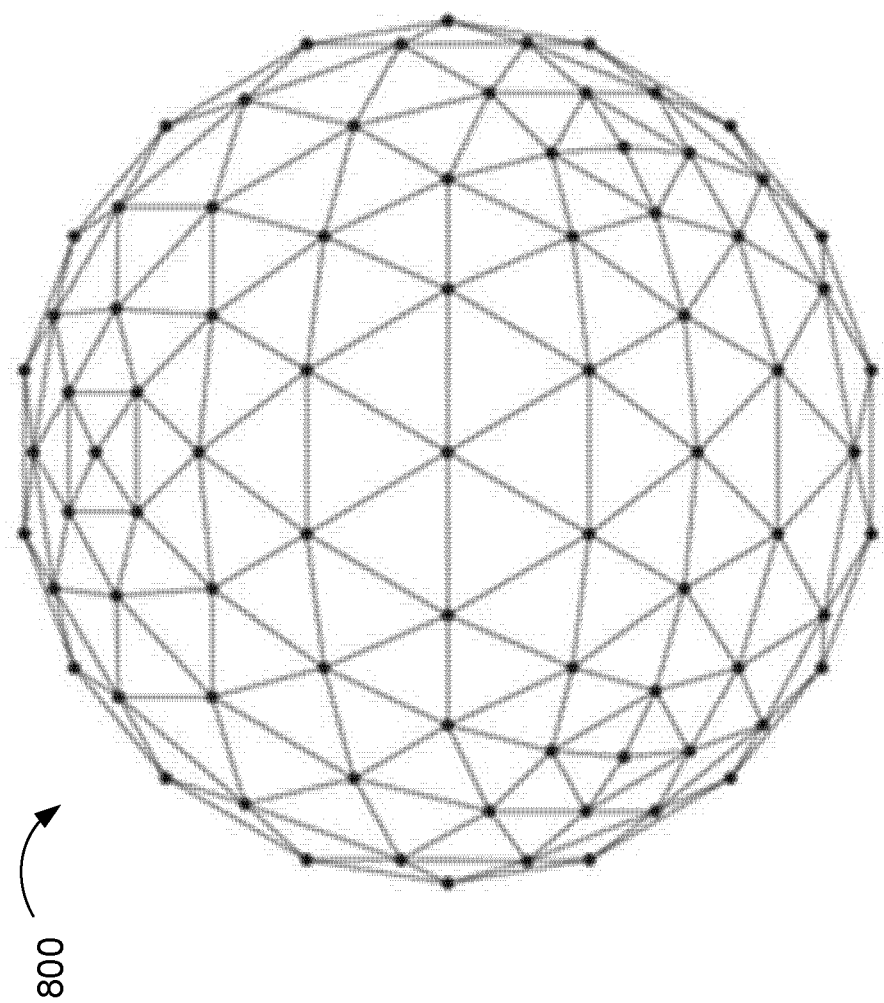
FIG. 8 is an example of a polygonal mesh corresponding to spherical object, according to one embodiment.

As shown, the method begins at step 702, where the processor receives a polygonal mesh. As described, the polygonal mesh may correspond to an artist-authored object. FIG. 8 is an example of a polygonal mesh 800 corresponding to spherical object, according to one embodiment. As shown, the polygonal mesh 800 is comprises of a series of triangles.

Figure 9:
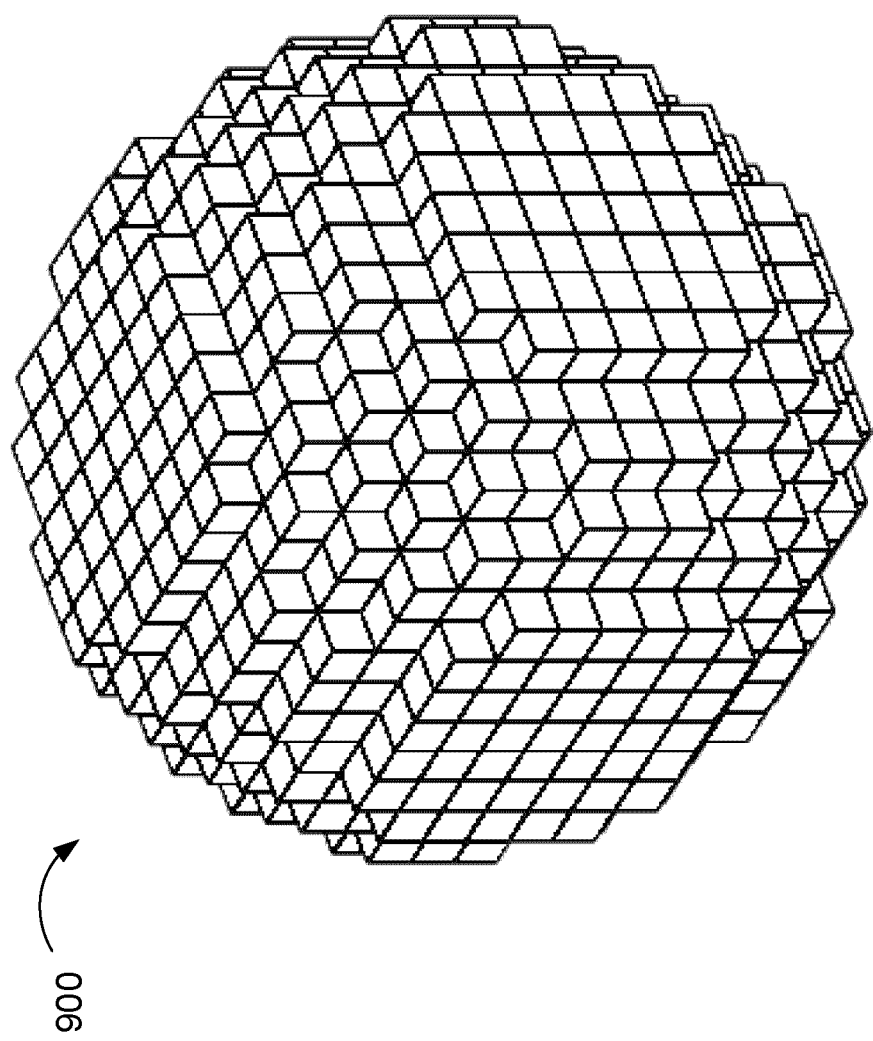
FIG. 9 is an example of a 3D voxel grid, according to one embodiment.

At step 704, the processor generates a 3D voxel grid corresponding to the polygonal mesh. In three-dimensional (3D) computer graphics, a voxel represents a value on a regular grid in 3D space. FIG. 9 is an example of a 3D voxel grid 900, according to one embodiment. As shown in FIG. 9, the 3D voxel grid 900 is comprised of a series of voxels (e.g., cubes) that approximate the shape of the polygonal mesh 800. It is noted that, in some embodiments, the 3D voxel grid 900 is "hollow" on the inside, and merely approximates the locations of the polygons of the polygonal mesh 800, which itself can be infinitely thin and comprises a series of polygonal surfaces and is "hollow" on the inside.

In various embodiments, generating the 3D voxel grid 900 from an input polygonal mesh 800 can be done in variety of ways. In one embodiment, the 3D voxel grid 900 is fitted to the axial bounds of the input polygonal mesh 800. In this embodiment, voxels are added to the 3D voxel grid 900 at coordinates that overlap the polygons of the input polygonal mesh 800. In other embodiments, voxels are added to the 3D voxel grid 900 at coordinates that are just inside or just outside the polygons of the input polygonal mesh 800.

In various embodiments, the size and/or shape of the voxels of the 3D voxel grid 900 are customizable. In some examples, the voxels are cubes, but in other embodiments, the voxels may have a rectangular or other shape. Also, the size (i.e., resolution) of the voxels can be customizable.

It is noted also that, in some embodiments, the input polygonal mesh may not be a closed volume. For example, for a polygonal mesh of a house object, the input polygonal mesh may comprise polygons defining four walls and a roof, but there may be no polygons that define a bottom surface (or floor) of the polygonal mesh of the house object. There may also be other small gaps in the polygonal mesh, if, for example, the polygonal mesh comprises of a set of sub-meshes that do not perfectly create closed volume. In such embodiments, it is noted that the size of the voxels (i.e., the resolution of the 3D voxel grid) constrains how small of gaps can be closed by voxelization of the polygonal mesh.

Referring back to FIG. 7, at step 706, the processor fills voids in the 3D voxel grid 900 to generate a voxel volume. As described, the 3D voxel grid 900 may be hollow. In other words, the 3D voxel grid 900 forms a "shell" of voxels that approximates the surfaces of the polygons input polygonal mesh 800. In the case of a 3D voxel grid forming an enclosed volume, filling the voids in the 3D voxel grid 900 comprises filling the voxels within the enclosed volume to generate the voxel volume.

In the case of 3D voxel grid that does not form an enclosed volume (e.g., such as a 3D voxel grid of a house object that includes four sides and a roof, but no floor, as described above), voxels are first added to enclose the volume, and then the enclosed volume is filled with voxels to generate the voxel volume. In some embodiments, filling the enclosed volume with voxels may be achieved by filling void voxels differently below a minimum voxel height, e.g., the minimum extent of the model within the voxel volume.

At step 708, the processor extracts a boundary of the voxel volume to generate a boundary mesh. The boundary mesh may be a polygonal mesh (i.e., a mesh with vertices, polygonal faces, and edges) that approximates the surface of the voxel volume.

Figure 10:
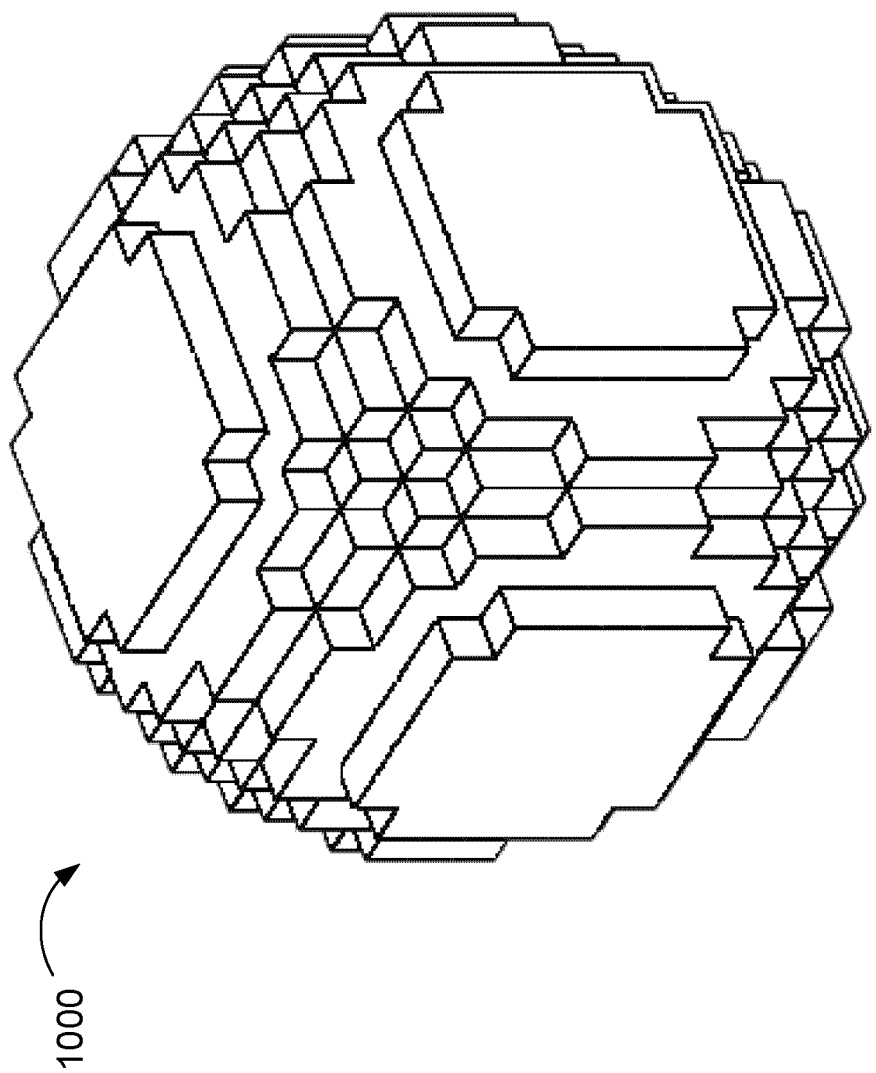
FIG. 10 is an example of a boundary mesh of a voxel volume, according to one embodiment.

FIG. 10 is an example of a boundary mesh 1000 of a voxel volume, according to one embodiment. As shown in FIG. 10, the surfaces of the boundary mesh 1000 follow the outer surface of a voxel volume (e.g., such as a voxel volume corresponding to the 3D voxel grid 900). In one embodiment, generating the boundary mesh 1000 from the voxel volume may be done by marching cubes. Marching cubes is a computer graphics algorithm for extracting a polygonal mesh from a three-dimensional discrete scalar field (such as, for example, a voxel).

In some embodiments, the boundary mesh 1000 could be used as a proxy mesh for an input polygonal mesh 800, but the boundary mesh 100 may blocky, as shown in FIG. 10, since it is derived from the voxel volume. Using a blocky object as a proxy object may produce poor results, so the boundary mesh 1000 can be smoothed.

Figure 11:
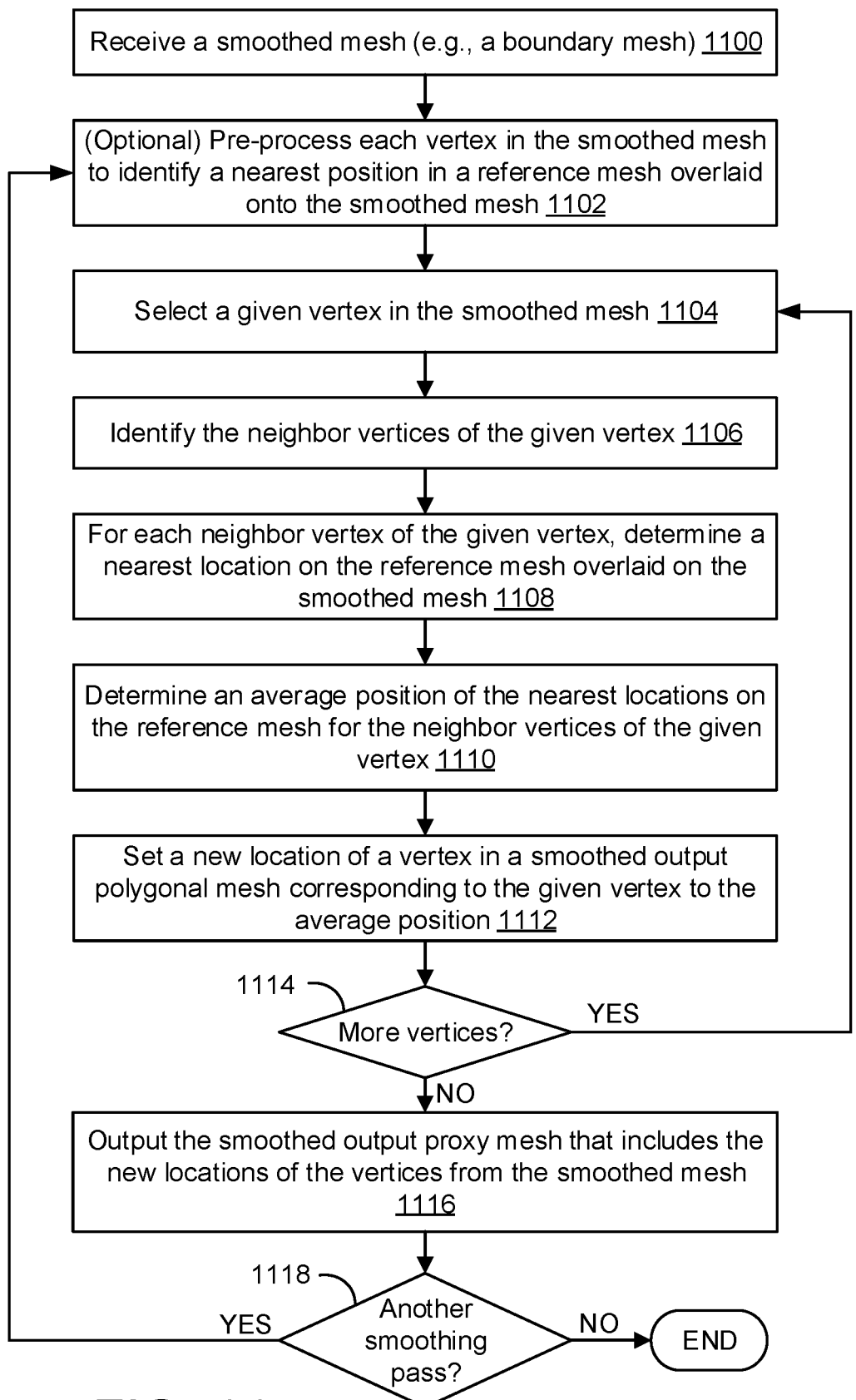
FIG. 11 is a flow diagram of method steps for generating a proxy mesh using conformed smoothing, according to one embodiment.

FIG. 11 is a flow diagram of method steps for generating a proxy mesh using conformed smoothing, according to one embodiment. In various implementations, the method can be performed by the processor 110, the graphics processor 116, or a combination of the processor 110 and the graphics processor 116.

As shown, the method begins at step 1100, where the processor receives a smoothed mesh, where the smoothed mesh is a polygonal mesh. In one embodiment, the smoothed mesh is a boundary mesh, where the boundary mesh is a polygonal mesh generated from a voxelized version of a reference mesh (i.e., the input polygonal mesh), such as using the method of FIG. 7. In other embodiments, the smoothed mesh can be any polygonal mesh that is a smoothed representation of a reference mesh, and is not necessarily a "boundary mesh" as described in FIG. 7.

At step 1102, the processor optionally pre-processes each vertex in the smoothed mesh to identify a nearest position for each vertex in a reference mesh overlaid onto the smoothed mesh.

Figure 12:
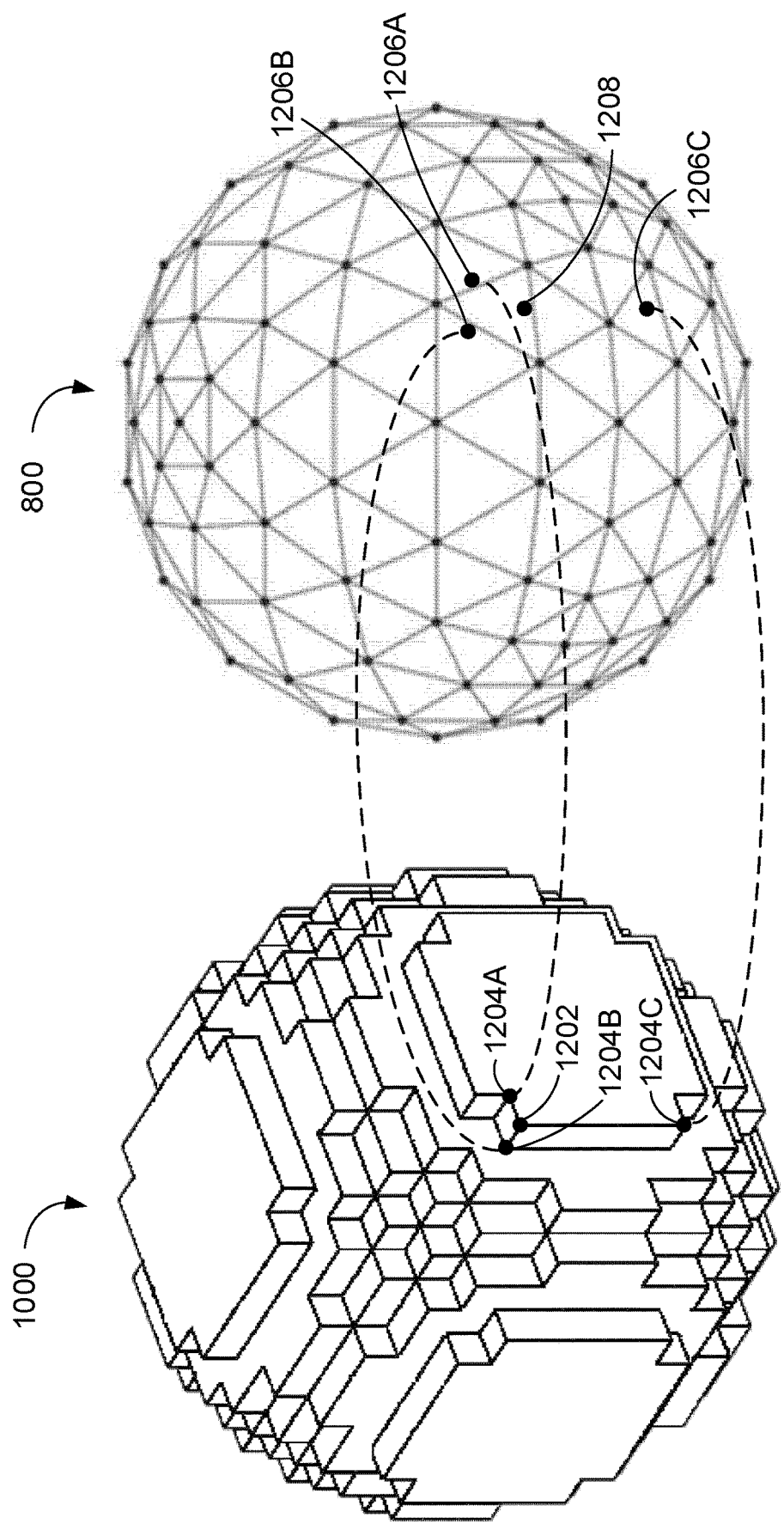
FIG. 12 illustrates a reference mesh and a boundary mesh, according to one embodiment.

An example is shown in FIG. 12, which illustrates a reference mesh 800 and a boundary mesh 1000 as the smoothed mesh, according to one embodiment. In FIG. 12, the reference mesh 800 and the boundary mesh 1000 are shown side-by-side for clarity of description. However, the reference mesh 800 and the boundary mesh 1000 can be overlaid onto one another on a common coordinate axis.

As shown in FIG. 12, the boundary mesh 1000 has many vertices, including vertices 1202, 1204A, 1204B, 1204C. The reference mesh 800 can be overlaid onto the boundary mesh 1000, for example, by matching the reference mesh 800 and the boundary mesh 1000 to a common coordinate grid. After the reference mesh 800 is overlaid onto the boundary mesh 1000, for each vertex in the boundary mesh 1000, the nearest location on the reference mesh 800 can be determined.

Using vertices 1204A, 1204B, and 1204C in the boundary mesh 1000 as examples, the nearest locations in the reference mesh 800 are locations 1206A, 106B, and 1206C, respectively. In one embodiment, the nearest location in the reference mesh 800 for a given vertex in the boundary mesh 1000 is any location on the reference mesh 800, including a location on a face (i.e., polygon) of the reference mesh 800. In another embodiment, the nearest location in the reference mesh 800 for a given vertex in the boundary mesh 1000 is the nearest vertex on the reference mesh 800.

In some embodiments, an "orientation test" can be performed to determine whether, for a given neighbor vertex of the boundary mesh 1000, the nearest location on the reference mesh 800 provides a valid data point for the given neighbor vertex. In some examples, the neatest location on the reference mesh 800 identified for a given neighbor vertex on the boundary mesh 1000 may lie on a completely opposite side of the object corresponding to the reference mesh 800. One example where this may occur is in situations where the reference mesh 800 is "thin" in some areas, such that two oppositely oriented sides of the reference mesh 800 are both nearby, and the identified nearest point on the reference mesh 800 may lie on either surface depending on the exact location of the given neighbor vertex on the boundary mesh 1000. Another example is in cases where the reference mesh 800 is not an enclosed volume (e.g., the example provided earlier of a reference mesh 800 of a house object with four walls, a roof, but no floor), such that in some areas there may be no correctly oriented surface of the reference mesh nearby. In such cases, a naively chosen "nearest location" may be an invalid data point for computing a new location of a vertex using smoothing, and may be discarded.

In some embodiments, to perform the orientation test for a given vertex on the boundary mesh 1000, a vector for the surface normal of the boundary mesh at the vertex is determined. The nearest location on the reference mesh 800 is naively determined, and a vector for the surface normal on the reference mesh at the identified nearest location is determined. In some embodiments, these surface normals may be computed either as face normals, vertex normals, as averaged vertex normals, or as blended combinations of any of these. The vector for the surface normal at the vertex in the boundary mesh 1000 is then compared to the vector for the surface normal at the nearest location in the reference mesh 800. If the two normal vectors are oriented in the same direction, for example, within a threshold angle, the two vectors are determined to be oriented in the same direction. In one embodiment, a dot product of the surface normal of the vertex in the boundary mesh 1000 and the surface normal of the nearest location in the reference mesh 800 is computed to determine whether the two vectors are oriented in the same direction. For example, if the dot product is positive, then it may be determined that the two surfaces are oriented similarly. In another more sophisticated embodiment, two separate dot products may be computed. These two dot products are the dot product of each of the two surface normals with a single 'drag' vector, which is just the direction vector from the vertex on the boundary mesh to the corresponding nearest point identified on the reference mesh (i.e., the direction in which the vertex on the boundary mesh would be 'dragged' if it were moved to the location of the found nearest point). In this embodiment, the signs of the two computed dot products may be compared instead: if their signs are identical, then the surfaces are determined to be oriented similarly; conversely, if their signs are opposite, then the surfaces are determined to be oriented oppositely. In any case, if the two surfaces are determined to be oriented similarly, then it is determined that the nearest location on the reference mesh 800 provides a valid data point. If the two surfaces are determined not to be oriented similarly, then it is determined that the nearest location on the reference mesh 800 provides an invalid data point and is discarded.

Referring back to FIG. 11, step 1102, after pre-processing each vertex in the smoothed mesh to identify a nearest position in the reference mesh overlaid onto the smoothed mesh, the nearest positions are stored in a data storage. As such, a lookup can be made into the data storage to find the nearest position in the reference mesh for a given neighbor vertex in the smoothed mesh. This provides the advantage that, if a given neighbor vertex is a neighbor vertex to two or more other vertices in the smoothed mesh, analyzing the reference mesh to find the nearest position in the reference mesh is performed just once for the given neighbor vertex and is stored in the data storage for later lookup, as opposed to analyzing the reference mesh to find the nearest position in the reference mesh each time that given neighbor vertex is analyzed.

At step 1104, the processor selects a given vertex in the smoothed mesh. In the example shown in FIG. 12, vertex 1202 may be selected as the given vertex.

At step 1106, the processor identifies the neighbor vertices of the given vertex on the smoothed mesh. In one embodiment, the neighbor vertices are identified as those vertices connected by an edge to the given vertex. In the example shown in FIG. 12, vertices 1204A, 1204B, and 1204C are identified as the neighbor vertices of the given vertex 1202.

At step 1108, for each neighbor vertex of the given vertex, the processor determines a nearest location on the reference mesh overlaid on the smoothed mesh. As previously described at step 1102, in one embodiment, the nearest location on the reference mesh overlaid on the smoothed mesh for each vertex in the smoothed mesh may be pre-computed and stored in a data storage. Determining, for each neighbor vertex of the given vertex, the nearest location on a reference mesh may include looking up this information in the data storage. In embodiments where the nearest location on the reference mesh for each vertex on the smoothed mesh has not already been pre-computed for each vertex in the smoothed mesh, the nearest location on the reference mesh (overlaid on the smoothed mesh) may be computed at this step.

In the example shown in FIG. 12, locations 1206A, 1206B, and 1206C in the reference mesh 800 are identified as the nearest locations to the neighbor vertices 1204A, 1204B, and 1204C, respectively, in the boundary mesh 1000 when the reference mesh 800 is overlaid on the boundary mesh 1000.

At step 1110, the processor determines an average position of the nearest locations on the reference mesh for the neighbor vertices of the given vertex in the smoothed mesh. In one embodiment, computing the average position comprises averaging the x-coordinate, y-coordinate, and z-coordinate values of the nearest locations on the reference mesh for the neighbor vertices of the given vertex in the smoothed mesh. In the example shown in FIG. 12, average position 1208 is determined as the average position of locations 1206A, 1206B, and 1206C. In one embodiment, at step 1110, only those nearest locations on the reference mesh that pass the "orientation test" described above are used when computing the average position. Locations that do not pass the orientation test may be discarded when computing the average position.

At step 1112, the processor sets a new location of a vertex in a smoothed output polygonal mesh corresponding to the given vertex to the average position. In some embodiments, instead of setting the new location of a vertex exactly to the average position, the processor may instead compute an intermediate location that is a blend (for example, an average) of the vertex's current location and the average position.

At step 1114, the processor determines whether there are more vertices to process in the smoothed mesh. If yes, the method returns to step 1104, described above, where the processor selects another given vertex in the smoothed mesh to process. If there are no more vertices left to process in the smoothed mesh (i.e., new locations for all the vertices in the smoothed mesh have been computed using steps 1104 to 1112 for each vertex), then the method proceeds to step 1116.

At step 1116, the processor outputs the smoothed output proxy mesh that includes the new locations of the vertices from the smoothed mesh. The smoothed output proxy mesh can be used for graphics operations in place of an artist-authored mesh that corresponds to the smoothed mesh. Completing step 1116 comprises completing one pass of performing conformed smoothing.

At step 1118, the processor determines whether additional passes of conformed smoothing should be performed. In no, the method ends. If yes, the method returns to step 1102, described above, where the processor optionally pre-processes each vertex to identify a nearest position for each vertex in a reference mesh. In the second and each subsequent pass through step 1102, rather than using the smoothed mesh (i.e., the smoothed mesh received at step 1100), the smoothed output proxy mesh generated at step 1116 is used in the pre-processing step 1102.

In some embodiments, the smoothed output proxy mesh generated after one or more passes through the method of FIG. 11 is used as a proxy object. In other embodiments, the the smoothed output proxy mesh generated after one or more passes through the method of FIG. 11 is simplified before being used as a proxy object. Although the smoothed output proxy mesh is now smooth, the smoothed output proxy mesh may still be too complex for use as a proxy object. Thus, the smoothed output proxy mesh may be simplified using mesh simplification, such as by using traditional edge collapse simplification, or any other mesh simplification technique could be used.

In sum, embodiments of the disclosure provide a technique for conformed smoothing where, when computing new locations for each vertex of a mesh during the smoothing process, instead of averaging the current positions of the neighbor vertices of the vertex on the mesh being smoothed (i.e., like in Laplacian smoothing), the new locations for the vertex consider the nearest locations on another mesh (i.e., the original input mesh or "reference mesh") to each of the neighbor vertices in the mesh being smoothed. These nearest locations on the original input mesh are then averaged to determine the new location for the vertex. The disclosed embodiments therefore preserve more features and detail of the original input mesh in the smoothed proxy mesh, which provides better visual results.

An example comparing the smoothing results of using conventional Laplacian smoothing to using the disclosed conformed smoothing is shown in FIGS. 13A-13D.

Figure 13D:
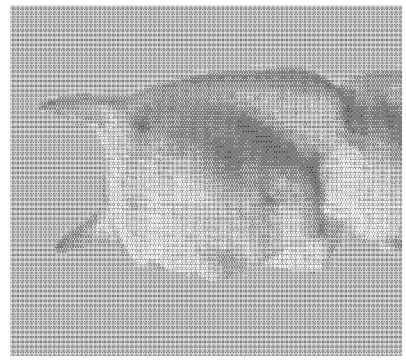
FIG. 13D illustrates an example of the voxel volume in FIG. 13B smoothed via conformed smoothing according to FIG. 11, according to one embodiment.
Figure 13C:
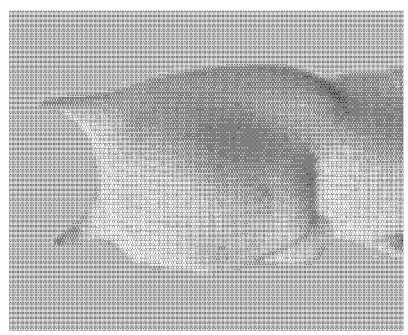
FIG. 13C illustrates an example of the voxel volume in FIG. 13B smoothed via Laplacian smoothing, according to one embodiment.
Figure 13B:
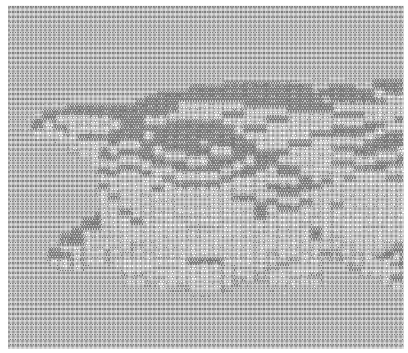
FIG. 13B illustrates a voxel volume corresponding to the polygonal mesh in FIG. 13A, according to one embodiment.
Figure 13A:
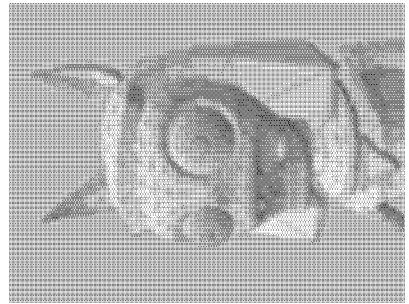
FIG. 13A illustrates an example polygonal mesh, according to one embodiment.

FIG. 13A illustrates an example polygonal mesh, according to one embodiment.

FIG. 13B illustrates a voxel volume corresponding to the polygonal mesh in FIG. 13A, according to one embodiment.

FIG. 13C illustrates an example of the voxel volume in FIG. 13B smoothed via Laplacian smoothing, according to one embodiment.

FIG. 13D illustrates an example of the voxel volume in FIG. 13B smoothed via conformed smoothing according to FIG. 11, according to one embodiment. As seen by comparing the results in FIG. 13C (i.e., Laplacian smoothing) and FIG. 13D (i.e., conformed smoothing), more features and detail of the original input mesh (i.e., shown in FIG. 13A) are preserved in the proxy mesh formed by conformed smoothing in FIG. 13D.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for generating a proxy mesh, the method comprising:
   receiving, by one or more processors, a reference mesh, wherein the reference mesh comprises a polygonal mesh that is a computer representation of a three-dimensional (3D) object;
   receiving, by the one or more processors, a smoothed mesh corresponding to the reference mesh;
   selecting, by the one or more processors, a given vertex in the smoothed mesh;
   identifying, by the one or more processors, neighbor vertices of the given vertex in the smoothed mesh;
   for each neighbor vertex of the given vertex in the smoothed mesh, determining, by the one or more processors, a nearest location on the reference mesh overlaid on the smoothed mesh;
   determining, by the one or more processors, an average position of the nearest locations on the reference mesh for the neighbor vertices of the given vertex;
   setting, by the one or more processors, a new location of a vertex in a smoothed output polygonal mesh corresponding to the given vertex to the average position; and
   outputting, by the one or more processors, the smoothed output polygonal mesh as a proxy mesh for the reference mesh.

2. The method according to claim 1, wherein the smoothed mesh comprises a boundary mesh, wherein the boundary mesh comprises a polygonal mesh that is generated based on a voxel volume corresponding to the reference mesh, wherein generating the boundary mesh comprises:
   generating a 3D voxel grid corresponding to the reference mesh, wherein the 3D voxel grid comprises a set of voxels that approximates a shape of the reference mesh;
   filling voids in the 3D voxel grid to generate a voxel volume; and
   extracting a boundary of the voxel volume to generate the boundary mesh.

3. The method according to claim 2, wherein filling the voids in the 3D voxel grid to generate the voxel volume comprises:
   adding voxels to the 3D voxel grid to create an enclosed volume; and
   filling voxels within the enclosed volume to generate the voxel volume.

4. The method according to claim 1, further comprising:
pre-processing each vertex in the smoothed mesh to identify a nearest location in the reference mesh overlaid onto the smoothed mesh; and
storing the nearest locations in a data storage;
wherein determining, for each neighbor vertex of the given vertex in the smoothed mesh, the nearest location on the reference mesh overlaid on the smoothed mesh comprises performing a lookup in the data storage for the nearest location on the reference mesh corresponding to the given vertex in the smoothed mesh.

5. The method according to claim 1, further comprising performing an orientation test to determine, for a given neighbor vertex of the given vertex in the smoothed mesh, whether the nearest location on the reference mesh provides a valid data point for the given neighbor vertex.

6. The method according to claim 5, wherein performing the orientation test comprises:
determining a first surface normal of the given neighbor vertex;
determining a second surface normal of the nearest location on the reference mesh for the given neighbor vertex;
calculating a dot product of the first surface normal of the given neighbor vertex and the second surface normal of the nearest location on the reference mesh for the given neighbor vertex; and
determining that the nearest location on the reference mesh provides a valid data point for the given neighbor vertex based on the dot product.

7. The method according to claim 1, further comprising:
determining, for each vertex in the smoothed mesh, a new location of a vertex the smoothed output polygonal mesh based on the nearest locations on the reference mesh of neighbor vertices of the vertex in the smoothed mesh.

8. A non-transitory computer-readable storage medium storing instructions that, when executed by one or more processors, causes a computing device to generate a proxy mesh, by performing the steps of:
receiving a reference mesh, wherein the reference mesh comprises a polygonal mesh that is a computer representation of a three-dimensional (3D) object;
receiving a smoothed mesh corresponding to the reference mesh;
selecting a given vertex in the smoothed mesh;
identifying neighbor vertices of the given vertex in the smoothed mesh;
for each neighbor vertex of the given vertex in the smoothed mesh, determining a nearest location on the reference mesh overlaid on the smoothed mesh;
determining an average position of the nearest locations on the reference mesh for the neighbor vertices of the given vertex;
setting a new location of a vertex in a smoothed output polygonal mesh corresponding to the given vertex to the average position; and
outputting the smoothed output polygonal mesh as a proxy mesh for the reference mesh.

9. The computer-readable storage medium according to claim 8, wherein the smoothed mesh comprises a boundary mesh, wherein the boundary mesh comprises a polygonal mesh that is generated based on a voxel volume corresponding to the reference mesh, wherein generating the boundary mesh comprises:
generating a 3D voxel grid corresponding to the reference mesh, wherein the 3D voxel grid comprises a set of voxels that approximates a shape of the reference mesh;
filling voids in the 3D voxel grid to generate a voxel volume; and
extracting a boundary of the voxel volume to generate the boundary mesh.

10. The computer-readable storage medium according to claim 9, wherein filling the voids in the 3D voxel grid to generate the voxel volume comprises:
adding voxels to the 3D voxel grid to create an enclosed volume; and
filling voxels within the enclosed volume to generate the voxel volume.

11. The computer-readable storage medium according to claim 8, the steps further comprising:
pre-processing each vertex in the smoothed mesh to identify a nearest location in the reference mesh overlaid onto the smoothed mesh; and
storing the nearest locations in a data storage;
wherein determining, for each neighbor vertex of the given vertex in the smoothed mesh, the nearest location on the reference mesh overlaid on the smoothed mesh comprises performing a lookup in the data storage for the nearest location on the reference mesh corresponding to the given vertex in the smoothed mesh.

12. The computer-readable storage medium according to claim 8, the steps further comprising performing an orientation test to determine, for a given neighbor vertex of the given vertex in the smoothed mesh, whether the nearest location on the reference mesh provides a valid data point for the given neighbor vertex.

13. The computer-readable storage medium according to claim 12, wherein performing the orientation test comprises:
determining a first surface normal of the given neighbor vertex;
determining a second surface normal of the nearest location on the reference mesh for the given neighbor vertex;
calculating a dot product of the first surface normal of the given neighbor vertex and the second surface normal of the nearest location on the reference mesh for the given neighbor vertex; and
determining that the nearest location on the reference mesh provides a valid data point for the given neighbor vertex based on the dot product.

14. The computer-readable storage medium according to claim 8, further comprising:
determining, for each vertex in the smoothed mesh, a new location of a vertex the smoothed output polygonal mesh based on the nearest locations on the reference mesh of neighbor vertices of the vertex in the smoothed mesh.

15. A device for generating a proxy mesh, the device comprising:
a memory storing instructions; and
one or more processors configured to the execute the instructions to cause the device to:
receive a reference mesh, wherein the reference mesh comprises a polygonal mesh that is a computer representation of a three-dimensional (3D) object;
receive a smoothed mesh corresponding to the reference mesh;
select a given vertex in the smoothed mesh;
identify neighbor vertices of the given vertex in the smoothed mesh;

for each neighbor vertex of the given vertex in the smoothed mesh, determine a nearest location on the reference mesh overlaid on the smoothed mesh;

determine an average position of the nearest locations on the reference mesh for the neighbor vertices of the given vertex;

set a new location of a vertex in a smoothed output polygonal mesh corresponding to the given vertex to the average position; and output the smoothed output polygonal mesh as a proxy mesh for the reference mesh.

16. The device according to claim 15, wherein the smoothed mesh comprises a boundary mesh, wherein the boundary mesh comprises a polygonal mesh that is generated based on a voxel volume corresponding to the reference mesh, wherein generating the boundary mesh comprises:

generating a 3D voxel grid corresponding to the reference mesh, wherein the 3D voxel grid comprises a set of voxels that approximates a shape of the reference mesh;

filling voids in the 3D voxel grid to generate a voxel volume; and extracting a boundary of the voxel volume to generate the boundary mesh.

17. The device according to claim 16, wherein filling the voids in the 3D voxel grid to generate the voxel volume comprises:

adding voxels to the 3D voxel grid to create an enclosed volume; and filling voxels within the enclosed volume to generate the voxel volume.

18. The device according to claim 15, wherein the one or more processors executing the instructions further causes the device to:

pre-process each vertex in the smoothed mesh to identify a nearest location in the reference mesh overlaid onto the smoothed mesh; and store the nearest locations in a data storage;

wherein determining, for each neighbor vertex of the given vertex in the smoothed mesh, the nearest location on the reference mesh overlaid on the smoothed mesh comprises performing a lookup in the data storage for the nearest location on the reference mesh corresponding to the given vertex in the smoothed mesh.

19. The device according to claim 15, wherein the one or more processors executing the instructions further causes the device to:

perform an orientation test to determine, for a given neighbor vertex of the given vertex in the smoothed mesh, whether the nearest location on the reference mesh provides a valid data point for the given neighbor vertex.

20. The device according to claim 19, wherein performing the orientation test comprises:

determining a first surface normal of the given neighbor vertex;

determining a second surface normal of the nearest location on the reference mesh for the given neighbor vertex;

calculating a dot product of the first surface normal of the given neighbor vertex and the second surface normal of the nearest location on the reference mesh for the given neighbor vertex; and determining that the nearest location on the reference mesh provides a valid data point for the given neighbor vertex based on the dot product.

* * * * *